US010400346B2

(12) United States Patent
Cho et al.

(10) Patent No.: US 10,400,346 B2
(45) Date of Patent: Sep. 3, 2019

(54) MICROSCALE THREE-DIMENSIONAL ELECTRIC DEVICES AND METHODS OF MAKING THE SAME

(71) Applicant: Regents of the University of Minnesota, Minneapolis, MN (US)

(72) Inventors: Jeong-Hyun Cho, Woodbury, MN (US); Daeha Joung, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 405 days.

(21) Appl. No.: 15/482,386

(22) Filed: Apr. 7, 2017

(65) Prior Publication Data

US 2017/0294698 A1 Oct. 12, 2017

Related U.S. Application Data

(60) Provisional application No. 62/319,998, filed on Apr. 8, 2016.

(51) Int. Cl.

| | |
|---|---|
| ***B23K 1/00*** | (2006.01) |
| ***C25D 3/00*** | (2006.01) |
| ***C25D 3/12*** | (2006.01) |
| ***C23C 28/00*** | (2006.01) |
| ***C25D 5/02*** | (2006.01) |

(Continued)

(52) U.S. Cl.

CPC ................ *C25D 3/12* (2013.01); *C23C 14/20* (2013.01); *C23C 28/00* (2013.01); *C23C 28/322* (2013.01); *C23C 28/345* (2013.01); *C25D 5/02* (2013.01); *C25D 3/60* (2013.01)

(58) Field of Classification Search

CPC ....... C23C 14/20; C23C 28/00; C23C 28/322; C23C 28/345; C25D 3/12; C25D 3/60; C25D 5/02; B23K 1/00

USPC .......................................................... 228/176

See application file for complete search history.

(56) References Cited

U.S. PATENT DOCUMENTS

| | | |
|---|---|---|
| 8,236,259 B2 | 8/2012 | Gracias et al. |
| 8,246,917 B2 | 8/2012 | Gracias et al. |
| 8,703,073 B2 | 4/2014 | Gracias et al. |

(Continued)

FOREIGN PATENT DOCUMENTS

| | | |
|---|---|---|
| WO | 2010129319 A2 | 11/2010 |

OTHER PUBLICATIONS

Whitesides et al., "Self-Assembly at All Scales", Science, Mar. 29, 2002, vol. 295, p. 2418.

(Continued)

*Primary Examiner* — Erin B Saad

(74) *Attorney, Agent, or Firm* — Dicke, Billig & Czaja, PLLC

(57) ABSTRACT

Functionalized microscale 3D devices and methods of making the same. The 3D microdevice can be realized with the combination of top-down (lithographic) and bottom-up (origami-inspired self-assembly) processes. The origami-inspired self-assembly approach combined with a top-down process can realize 3D microscale polyhedral structures with metal/semiconductor materials patterned on dielectric materials. In some embodiments, the functionalized 3D microdevices include resonator-based passive sensors, i.e. split ring resonators (SRRs), on 3D, transparent, free-standing, dielectric media ($Al_2O_3$).

20 Claims, 13 Drawing Sheets

46
24a
22a
42a
22c
42

(51) Int. Cl.
*C23C 14/20* (2006.01)
*C25D 3/60* (2006.01)

(56) References Cited

U.S. PATENT DOCUMENTS

| | | | | |
|---|---|---|---|---|
| 8,709,829 | B2 | 4/2014 | Gracias et al. | |
| 2007/0020310 | A1* | 1/2007 | Gracias | A61K 9/0024 424/423 |
| 2010/0326071 | A1 | 12/2010 | Gracias et al. | |
| 2012/0135237 | A1 | 5/2012 | Gracias et al. | |
| 2013/0045530 | A1 | 2/2013 | Gracias et al. | |
| 2014/0320378 | A1 | 10/2014 | Gracias et al. | |
| 2017/0291819 | A1* | 10/2017 | Cho | G03F 7/40 |

OTHER PUBLICATIONS

Guo et al., "Two- and three-dimensional folding of thin film single-crystalline silicon for photovoltaic power applications", PNAS, Dec. 1, 2009, vol. 106, No. 48, 20149-20154.
Xu et al., "Assembly of micro/nanomaterials into complex, three-dimensional architectures by compressive buckling", Science, Jan. 9, 2015, vol. 347, Issue 6218, p. 154.
Cho et al., "Self-assembly of orthogonal three-axis sensors", Applied Physics Letters, 93, 043505 (2008).
Gracias et al., "Forming Electrical Networks in Three Dimensions by Self-Assembly", Science, Aug. 18, 2000, vol. 289, p. 1170.
Jeong et al., "Three-dimensional actuators transformed from the programmed two-dimensional structures via bending, twisting and folding mechanisms", Journal of Materials Chemistry, 2011, 21, 6824-6830.
Siegel et al., Microsolidics: Fabrication of Three-Dimensional Metallic Microstructures in Poly(dimethylsiloxane), Adv. Mater. 2007, 19, 727-733.
Braun, "Materials Chemistry in 3D Templates for Functional Photonics", Chem. Mater. 2014, 26, 277-286.
Song et al., "Three-Dimensional Integration of Organic Resistive Memory Devices", Adv. Mater. 2010, 22, 5048-5052.
Cho et al., "Nanoscale Origami for 3D Optics", Small 2011, 7, No. 14, 1943-1948.
Moser et al., "3D THz metamaterials from micro/nanomanufacturing", Laser Photonics Rev. 6, No. 2, 219-244 (2012).
Burckel et al., "Fabrication of 3D Metamaterial Resonators Using Self-Aligned Membrane Projection Lithography", Adv. Mater. 2010, 22, 3171-3175.
Burckel et al., "Micrometer-Scale Cubic Unit Cell 3D Metamaterial Layers", Adv. Mater. 2010, 22, 5053-5057.
Baena et al., "Isotropic frequency selective surfaces made of cubic resonators", Applied Physics Letters 91, 191105 (2007).
Baena et al., "Towards a systematic design of isotrophic bulk magnetic metamatenals using the cubic point groups of symmetry", Physical Review B 76, 245115 (2007).
Baena et al., "Electrically small isotropic three-dimensional magnetic resonators for metamaterial design", Applied Physics Letters 88, 134108 (2006).
Nguyen et al., "Direct Integration of Metal Oxide Nanowire in Vertical Field-Effect Transistor", Nano Letters, 2004, vol. 4, No. 4, 651-657.
Ishihara et al., "Monolithic 3D-ICs with single grain Si thin film transistors", Solid-State Electronics 71 (2012) 80-87.
Zhou et al., "Nonvolatile multilevel data storage memory device from controlled ambipolar charge trapping mechanism", Scientific Reports, 3:2319 (2013).
Andres et al., "Nanocomposite Microcontainers", Adv. Mater. 2012, 24, 4597-4600.
Randall et al., "3D lithographically fabricated nanoliter containers for drug delivery", Advanced Drug Delivery Reviews 59 (2007) 1547-1561.
Kuribayashi-Shigetomi et al., "Cell Origami: Self-Folding of Three-Dimensional Cell-Laden Microstructures Driven by Cell Traction Force", PLOS ONE, Dec. 2012, vol. 7, Issue 12, e51085 (8 pgs).
Leferink et al., "Engineered Micro-Objects as Scaffolding Elements in Cellular Building Blocks for Bottom-Up Tissue Engineering Approaches", Adv. Mater 2014, 26, 2592-2599.
Kiryukhin et al., "Adhesion of Polyelectrolyte Multilayers: Sealing and Transfer of Microchamber Arrays", Langmuir 2012, 28, 5678-5686.
Kong et al., "3D Printed Quantum Dot Light-Emitting Diodes", Nano Letters 2014, 14, 7017-7023.
Adams et al., "Conformal Printing of Electrically Small Antennas on Three-Dimensional Surfaces", Adv. Mater. 2011, 23, 1335-1340.
Soukoulis et al., "Past achievements and future challenges in the development of three-dimensional photonic metamaterials", Nature Photonics, vol. 5, Sep. 2011, 523-530.
Gu et al., "The Bonding of Nanowire Assemblies Using Adhesive and Solder", JOM, Dec. 2005, 60-64.
Bhawalkar et al., "Development of a Colloidal Lithography Method for Patterning Nonplanar Surfaces", Langmuir 2010, 26 (22), 16662-16666.
Cho et al., "Three Dimensional Nanofabrication Using Surface Forces", Langmuir 2010, 26 (21), 16534-16539.
Cho et al., "Self-Assembly of Lithographically Patterned Nanoparticles", Nano Letters 2009, vol. 9, No. 12, 4049-4052.
Cho et al., "Curving Nanostructures Using Extrinsic Stress", Adv. Mater. 2010, 22, 2320-2324.
Chen et al., "Manipulation of terahertz radiation using metamaterials", Laser Photonics Rev. 5, No. 4, 513-533 (2011).
Randall et al., "Size selective sampling using mobile, 3D nanoporous membranes", Anal. Bioanal. Chem. (2009) 393:1217-1224.
Leong et al., "Spatially Controlled Chemistry Using Remotely Guided Nanoliter Scale Containers", J. Am. Chem. Soc. 2006, 128, 11336-11337.
Xiang et al., "High ductility of a metal film adherent on a polymer substrate", Applied Physics Letters 87, 161910 (2005).
Syms et al., "Surface Tension-Powered Self-Assembly of Microstructures-The State-of-the-Art", Journal of Microelectromechanical Systems, vol. 12, No. 4, Aug. 2003, p. 387-417.
Leong et al., "Surface Tension-Driven Self-Folding Polyhedra", Langmuir 2017, 23, 8747-8751.
Carcia et al., "Gas diffusion ultrabarriers on polymer substrates using Al2O3 atomic layer deposition and SiN plasma-enhanced chemical vapor deposition", Journal of Applied Physics 106, 023533 (2009).
Cooper et al., "Protection of polymer from atomic-oxygen erosion using Al2O3 atomic layer deposition coatings", Thin Solid Films 516 (2008) 4036-4039.
Chen et al., "Complementary planar terahertz metamaterials", Optics Express, vol. 15, No. 3, p. 1084-1095 (Feb. 5, 2007).
Wendt et al., "Fabrication techniques for three-dimensional metamaterials in the midinfrared", J. Vac. Sci. Technol. B28(6), Nov./Dec. 2010, p. C6O30-C6033.

* cited by examiner

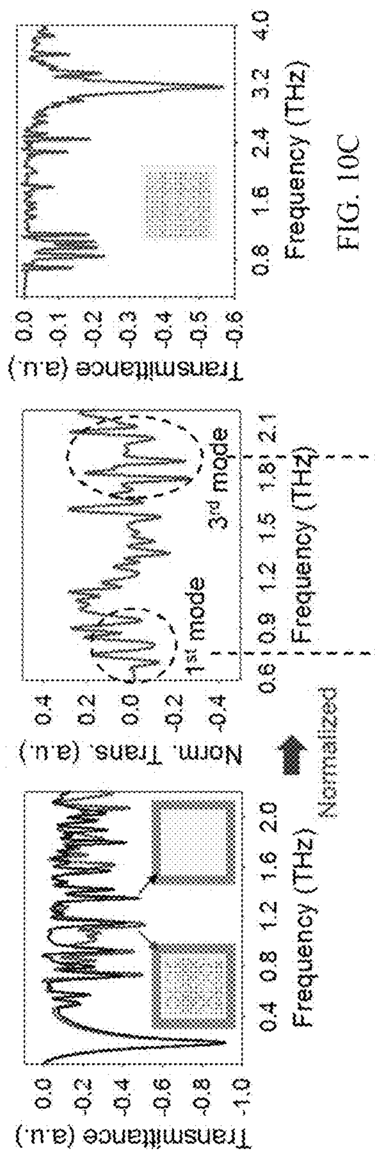
FIG. 10A
FIG. 10B
FIG. 10C
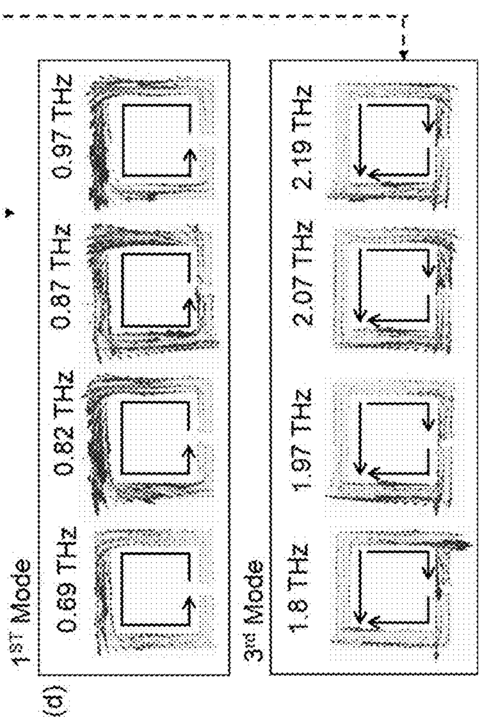
FIG. 10D

MICROSCALE THREE-DIMENSIONAL ELECTRIC DEVICES AND METHODS OF MAKING THE SAME

CROSS REFERENCE TO RELATED APPLICATION

This Non-Provisional Patent Application claims the benefit of the filing date of U.S. Provisional Patent Application Ser. No. 62/319,998 filed Apr. 8, 2016, entitled "MICROSCALE THREE-DIMENSIONAL ELECTRIC DEVICES AND METHODS OF MAKING THE SAME," the entire disclosure of which is herein incorporated by reference.

BACKGROUND

The present disclosure relates to microstructures. More particularly, it relates to functionalized microscale three-dimensional devices and methods of making the same.

Three-dimensional (3D) micro/nanostructures with various shapes, architectures, and materials have recently been the subject of increased attention, because their dimensionality strongly influences their physical and chemical responses to surrounding environmental media as compared to two-dimensional (2D) micro/nanostructures. With regard to design, the advances in 3D, heterogeneously integrated, electronic devices (electrical networks) or 3D, artificially structured materials have accelerated the development of a new class of biomedical, electronic, and optical systems. Beyond integration technology which incorporates electronics into 3D structures, a free-standing, hollow-structured electronic device can have the potential for diverse applications. Specifically, with the integration of an electronic circuit, it can be used for multifunctional devices including sensors, smart chemical storage containers, telecommunications instruments, optical detectors, or programmable capsules in biomedicine. One notable impact in building such a device is the enhancement of versatility through the use of microscale patterning on a 3D dielectric window substrate, which can have advantages for the following applications: (i) In metamaterials, split-ring resonators (SRRs) defined on 3D dielectric structures produce isotropic, tailored anisotropic optical, or magnetic responses; (ii) Metal and/or semiconductor material patterns on the 3D dielectric substrate can also be used for building 3D electric circuits including sensors, transistors, and memory devices; and (iii) Free-standing hollow structures can be used as 3D containers (or encapsulation) for targeted drug delivery. In order to fully serve these functions, micro- and nanoscale surface patterning on the 3D dielectric structures plays a crucial role and, therefore, must be realized.

Conventional 3D fabrications are typically built using layer-by-layer (LBL) lithographic patterning methods, 3D printing, and/or self-aligned membrane projection lithography. With these traditional methods, development of a 3D, hollow, polyhedral structure has not been possible. In addition, limited surface patterning in micro-scale has been achieved. However, since the conventional lithographic process is a top-down strategy, surface patterning on a free-standing enclosed hollow structure (i.e., 3D micro-container) has not been realized.

Current approaches for building 3D micro-electronic devices via self-assembly have a critical limitation as follows: During the metal (or metal oxide) deposition and self-assembly processes, the spatial stress distribution on the materials can induce cracking, buckling, and/or delamination of the thin films.

SUMMARY

The inventors of the present disclosure recognized that a need exists for functionalized microscale 3D devices and methods of making the same that overcomes one or more of the above-mentioned problems.

Some aspects of the present disclosure are directed to a method of making a functionalized 3D microdevice. The method includes forming a 2D intermediate structure including a plurality of micropanels and hinges. Each of the micropanels includes a metal frame, a window supported within the frame, and a microscale conductive pattern formed on the window. The window is formed of a dielectric material. The micropanels are connected to one another and arranged in an array. In this regard, respective ones of the hinges extend between and interconnect immediately adjacent ones of the panels within the array. The 2D intermediate structure is heated. With the step of heating, each of the hinges self-folds to transition the 2D intermediate structure into a functionalized 3D microdevice. In some embodiments, the step of forming a 2D intermediate structure includes forming a sacrificial layer over a substrate, depositing a protection layer over the sacrificial layer, and depositing a window material over the sacrificial layer to define the window of each of the panels. The sacrificial layer optionally is or includes poly(methyl methacrylate), and the protection layer optionally includes a first sub-layer of chromium as an adhesion layer and a second sub-layer of copper as a seed layer. In related embodiments, the step of forming a 2D intermediate structure includes depositing a second protection layer over the window material. With these and related embodiments, the window of each panel is sandwiched between opposing protection layers.

Some aspects of the present disclosure are directed to a 3D, free-standing, polyhedral, hollow structure with desired surface patterning on a dielectric material, for example aluminum oxide ($Al_2O_3$, 150 nm thick), in micro-scale to be used as a functionalized device. The 3D microdevices of the present disclosure can be realized with the combination of top-down (lithographic) and bottom-up (origami-inspired self-assembly) processes. The origami-inspired self-assembly approach combined with a top-down process can realize 3D micro/nanoscale polyhedral structures with surface patterning. In some embodiments, 2D, lithographically patterned, planar features are connected with hinges at the joints which fold up the structure when they are heated to their melting temperature. This process not only offers easy control of size and shape, allowing for fabrication of free-standing, hollow systems, but also supports surface patterning with metal/semiconductor materials on each face of the 3D device and large-scale production with a high yield. As a result, the methods of the present disclosure allow heterogeneous integrations with various materials which can produce free-standing, 3D, multifunctional devices. In turn, diverse applications in electronic circuits, as well as optical and biomedical modules, can be achieved. The methods of the present disclosure overcome challenges presented by 3D nanodevice (sub-500 nm sized) fabrication (e.g., low yield), providing a microscale, 3D structure integrated with various materials to enhance its functionality and uses. A 3D device in microscale of the present disclosure permits both high yield and controllability yet is still small enough for versatile applications including biomedical, microelectromechanical, and optoelectronic devices as well as metamaterials operating at mid-infrared (IR) and terahertz (THz) ranges.

Current approaches for building 3D micro-electronic devices via self-assembly have a critical limitation as follows: During the metal (or metal oxide) deposition and self-assembly processes, the spatial stress distribution on the materials can induce cracking, buckling, and/or delamination of the thin films. In order to overcome these difficulties, in some non-limiting embodiments of the present disclosure, an evolved self-assembly method with a sandwich type structure is provided. The sandwich structure allows the minimization of mechanical damages induced by chemical attack and external forces on the thin films during the fabrication processes, including self-assembly. With this strategy, 3D metamaterials are provided in accordance with principles of the present disclosure, for example SRRs resonating in the 0.3 to 2.0 THz region, defined on free-standing, microscale, 3D, dielectric, and polyhedral structures.

The free-standing, microscale, transparent, enclosed containers and 3D microscale devices of the present disclosure and corresponding evolved self-assembly methods of manufacture provide a marked improvement over previous designs and methodologies. In some embodiments, the functionalized 3D microdevices include resonator-based passive sensors, i.e. split ring resonators (SRRs), on 3D, transparent, free-standing, dielectric media ($Al_2O_3$). Since the 3D devices offer surface exposed to all directions, volumes encapsulated by a transparent thin film, and 3D coordinate information, which cannot be achieved with 2D configurations, the SRR sensors patterned on the 3D, cubic structure could be useful in environmental- and bio-sensing, both of which require spatial information showing distribution of the substances we want to detect. The methods of the present disclosure allow for building large scale, free-standing, microscale, 3D devices with a wide range of materials, shapes, and sizes with desired electric device patterning on the 3D device, which will result in the development of next generation biomedical, electronic, and optical devices, including sensors and electric circuits, utilizing the numerous advantages of 3D configurations.

As used throughout this disclosure, the terms "micro" and "microdevice" are in reference to dimensions of at least on the order of $10^{-6}$ m. The "microdevices" of the present disclosure are also inclusive of devices with dimensions on the order of $10^{-3}$ m (i.e., millimeters) and on the order of $10^{-2}$ m (i.e., centimeters).

BRIEF DESCRIPTION OF THE DRAWINGS

FIG. 10A is a graph of simulated transmittance response of a single $Al_2O_3$ window of a 3D microdevice described in the Examples section;

FIG. 10B is a graph of normalized measurement of THz transmittance described in the Examples section;

FIG. 10C is a graph of simulated transmittance response of SRRs on an $Al_2O_3$ window without an Ni frame described in the Examples section;

FIG. 10D illustrates surface current density distributions observed for each of the $1^{st}$ and $3^{rd}$ mode peaks of FIG. 10B.

DETAILED DESCRIPTION

Figure 1A:
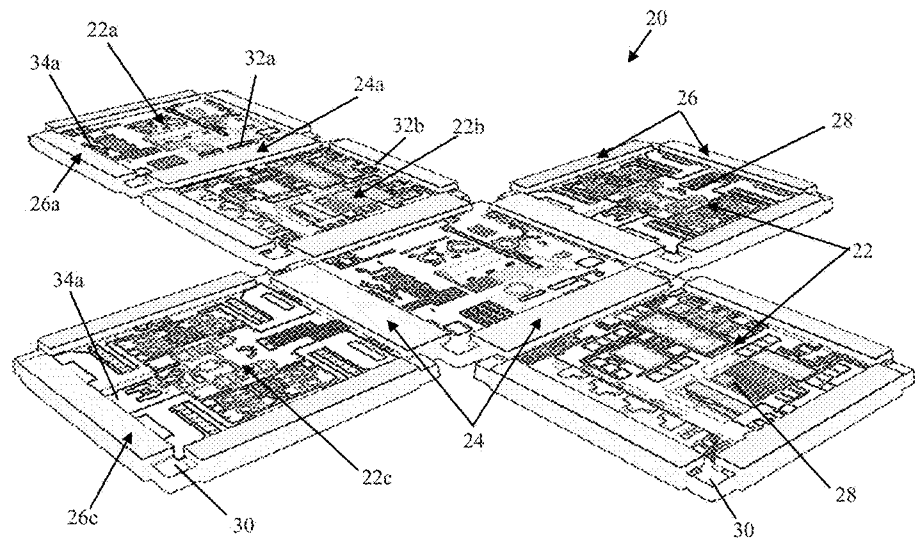
FIG. 1A is a perspective view of a 2D intermediate structure of micropanels useful in forming a functionalized 3D microdevice in accordance with principles of the present disclosure.

Aspects of the present disclosure are directed toward microscale, free-standing, functionalized 3D devices and methods of manufacture. In some embodiments, an origami-like self-folding manufacturing approach is employed. For example, FIG. 1A illustrates a 2D intermediate structure 20 from which a 3D microscale functionalized polyhedral (e.g., cubic) device can be generated. The 2D intermediate structure 20 includes a plurality of microscale panels 22, hinges 24, and optional joint structures 26. Each of the panels 22 includes a patterned window 28 and a metal frame 30. Exemplary constructions of the patterned windows 28, and the metal frames 30 are provided below. In general terms, the patterned window 28 can have a dielectric construction, and includes a desired microstructure (e.g., circuitry component(s) formed by an appropriate material such as a metal (e.g., Ti, Al, etc.), a semiconductor material, etc.) carried by a membrane or similar material that in some embodiments is an electrical insulator (e.g., $Al_2O_3$ film). The metal frame 30 supports the corresponding patterned window 28 and can be formed of various materials, such as nickel. Respective ones of the hinges 24 extend between and interconnect opposing edges of immediately adjacent ones of the panels 22 in the array of the 2D intermediate structure 20. A material of each of the hinges 24 is selected to exhibit desired properties in the presence of heat (e.g., molten, surface tension force), and in some embodiments is solder. As provided in the form of the 2D intermediate structure 20, the panels 22 are arranged in an array conducive to folding into a 3D polyhedral shape, with facing edges of immediately adjacent ones of the panels 22 being connected to one another by a corresponding one of the hinges 24. Stated otherwise, in the 2D intermediate structure array, various panels 22 are arranged side-by-side or edge-to-edge; one of the hinges 24 extends between and interconnects the corresponding edges thereof. For example, first and second panels 22*a*, 22*b* identified in FIG. 1A. In the array, the first panel 22*a* is immediately adjacent the second panel 22*b*, with a first edge 32*a* (referenced generally) of the first panel 22*a* facing or immediately proximate a first edge 32*b* of the second panel 22*b*. The first and second panels 22a, 22*b* are interconnected by a hinge 24*a* that extends between the first edges 32*a*, 32*b*. Other panel edges in the array of the 2D intermediate structure 20 are free or not otherwise directly connected to another panel by a hinge. For example, a second edge 34*a* of the first panel 22*a* identified in FIG. 1A is not directly connected to a separate panel in the 2D intermediate structure state. In some embodiments, a joint structure 26 is provided at one or more (including all) of the panel free edges. Where provided, the joint structure 26 projects beyond the edge of the corresponding panel 22 (e.g., FIG. 1A identifies joint structure 26*a* that is applied to the first panel 22*a* at the second edge 34*a* and projects beyond the second edge 34a). A material of each of the joint structures 26 can be identical to that of the hinges 24 for reasons made clear below.

Figure 1B:
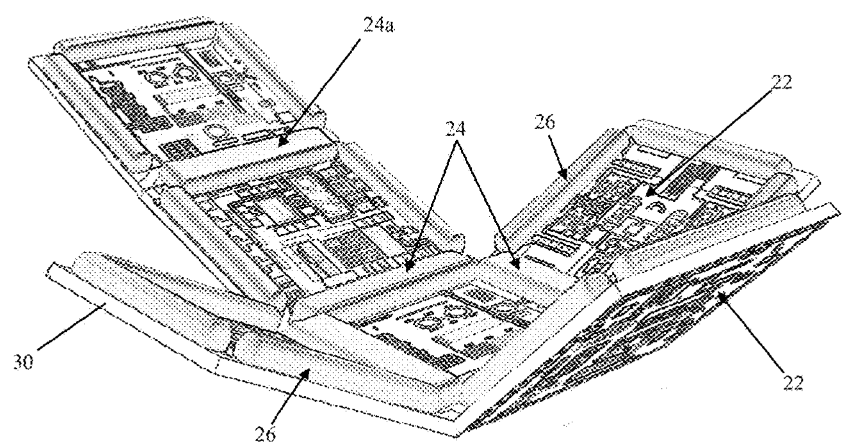
FIG. 1B is a perspective view of the 2D intermediate structure of FIG. 1A in an intermediate stage of self-folding in accordance with some methods of the present disclosure.
Figure 1C:
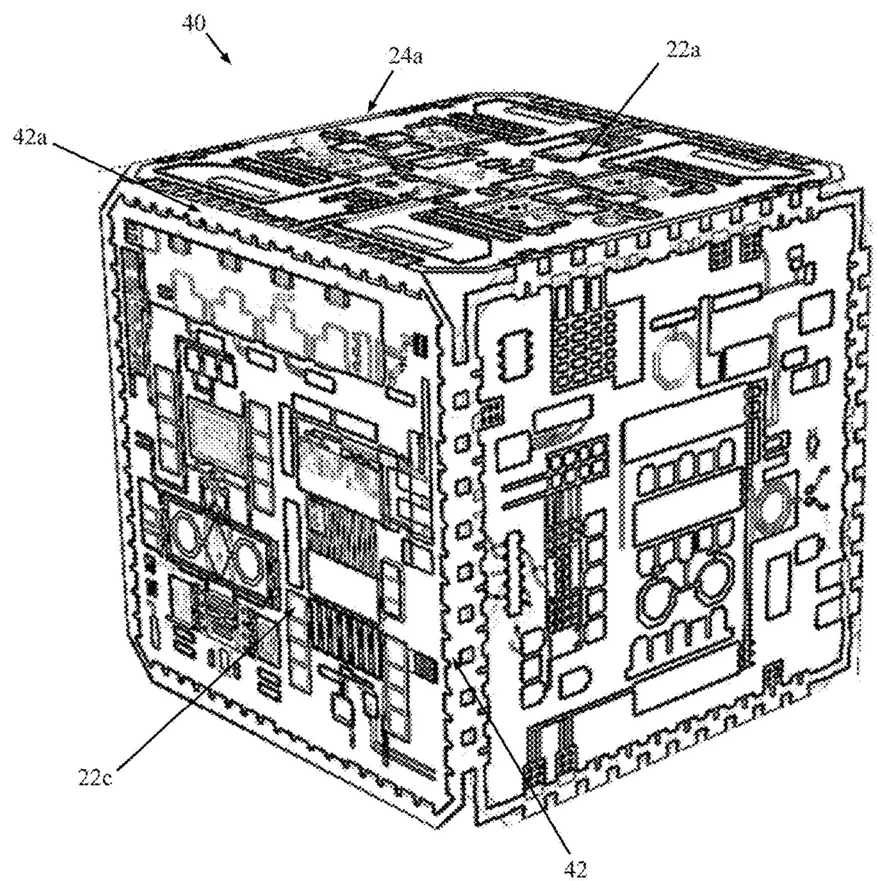
FIG. 1C is a perspective view of a 3D microscale device resulting from the 2D intermediate structure of FIG. 1A.

When the 2D intermediate structure 20 is subjected to heat, the molten hinges 24 generate a surface tension force and cause the panels 22 to self-fold up into a 3D microscale device. For example, FIG. 1B depicts an intermediate stage of self-folding of the hinges 24 when subjected to heat. As a point of reference, a comparison of FIG. 1A (prior to heating) and FIG. 1B (heating) reveals that the joint structures 26 (and the hinges 24) have a reduced width in the molten state. Because, in some embodiments, a thickness of the hinges 24 and of the joint structures 26 is much thinner than the corresponding width, a surface tension force reduces the width of the molten hinge 24 and the molten joint structure 26 to minimize surfaces area if the material of the hinge 24 or the joint structure 26 exhibits a dewetting property on the substrate. FIG. 1C illustrates a 3D microscale device 40 resulting from self-assembly of the 2D intermediate structure 20. As a point of reference, and with additional reference to FIG. 1A, where provided, various ones of the joint structures 26 are brought into contact with one another and fuse upon self-folding of the 2D intermediate structure 20, resulting in a completed joint 42 at a corresponding edge of the 3D microscale device 40. For example, the first joint structure 26 is identified with the first panel 22*a* in FIG. 1A, as is a first joint structure 26*c* provided with a third panel 22c. The first and third panels 22a, 22*c* are again labeled in FIG. 1C, along with the hinge 24a. With cross-reference between FIGS. 1A and 1C, one completed joint 42*a* of the 3D microscale device 40 is generated by the first joint structure 26*a* of the first panel 22*a* and the first joint structure 26*c* of the third panel 22*c* upon completion of the self-folding operation.

The 2D intermediate structures and resultant functionalized 3D microscale devices of the present disclosure can assume a wide variety of other shapes, such as any polyhedral shape, and are not limited to the cubic shape of FIG. 1C.

Fabrication of the 3D microdevices of the present disclosure begins with construction of the 2D intermediate structure. One non-limiting embodiment of a method for forming the 2D intermediate structure is shown in FIGS. 2A-2J. Initially, and with reference to FIG. 2A, a base substrate 50 is coated with a sacrificial layer 52. The base substrate 50 can assume various forms, and in some embodiments is silicon (Si), for example a silicon wafer. The sacrificial layer 52 can also have various constructions conducive to the methods below, and in some embodiments is poly(methyl methacrylate) (PMMA). The sacrificial layer 52 can be formed on the substrate 50 in various manners, and in some embodiment is spin-coated. In order to define micro structures (patterns), windows, panels, and hinges, a modified lift-off process can be employed some methods of the present disclosure. Unlike other conventional lift-off processes using a solvent-based remover such as acetone, the lift-off process in some embodiments of the present disclosure does not allow the use of a solvent to remove a photoresist layer spin-coated directly on top of the PMMA sacrificial layer 52 because PMMA also easily dissolves in the solvent. The sacrificial layer 52 (e.g., PMMA) must not be damaged during the metallization processes until the last step of a metal patterning (hinge structure). A lift-off via flood exposure can instead be applied in some embodiments in order to use a photoresist developer, which does not attack the PMMA (or other sacrificial layer material), instead of the solvent-based photoresist remover. On top of the sacrificial layer 52, desired photoresist patterning can be defined and Ti (or other material) can be deposited using, for example, an e-beam evaporator followed by lift-off. For example, and with reference to FIG. 2B, an optional first protection layer 54 is deposited over the sacrificial layer 52. The first protection layer 54 can assume various forms appropriate for protecting other applied materials (described below) from chemicals, stress, etc., and in some embodiments includes a first sub-layer 56 deposited onto the sacrificial layer 52, and a second sub-layer 58 deposited onto the first sub-layer 56 (e.g., the first sub-layer 56 can serve as an adhesion layer, and the second sub-layer 58 can serve as a seed layer). The first sub-layer 56 can be chromium (Cr) and the second sub-layer 58 can be copper (Cu), although other materials and constructions are also envisioned. The first and second sub-layers 56, 58 can be formed or deposited in various manners, such as e-beam evaporation techniques for example. In yet other embodiments, the first protection layer 54 can be omitted.

Figure 2A:
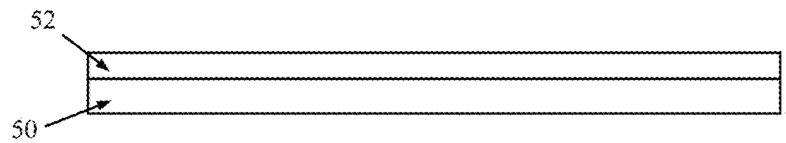
FIGS. 2A-2L are schematic illustrations of one non-limiting embodiment method of the present disclosure.
Figure 2B:
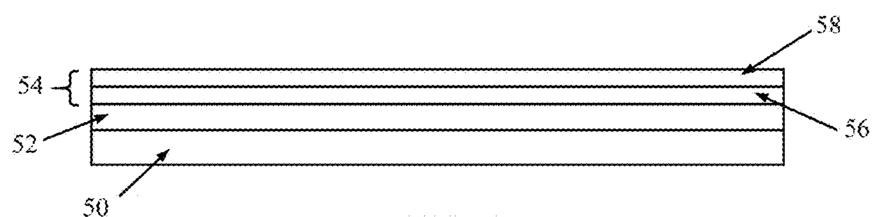
Figure 2C:
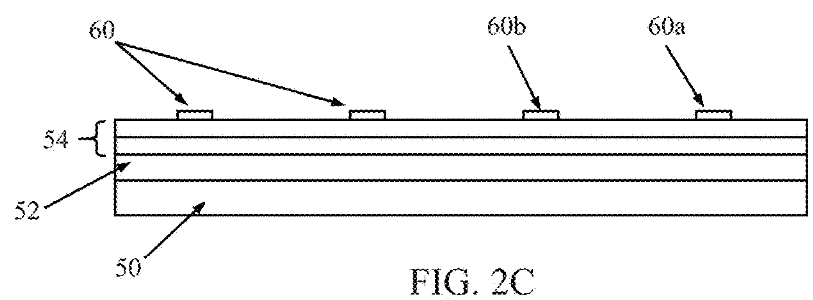

Desired patterns 60 (referenced generally) are formed over the sacrificial layer 52, such as onto the first protection layer 54 as shown in FIG. 2C. The patterns 60 can assume various forms, and in some embodiments are each a desired or selected electrical circuitry pattern. In some embodiments, then, a material of the patterns 60 is metal (e.g., titanium (Ti), aluminum (Al), etc.). As a point of reference, respective ones of the patterns 60 are generally reflected in FIG. 2C as being spaced apart or discrete from one another (e.g., a first pattern identified at 60*a* is spaced apart from a second pattern identified at 60*b*). This reflects that multiple individual panels will ultimately be formed with different materials, with each panel having its own individual pattern. With this in mind, the individual patterns 60 can be identical or different (e.g., the first pattern 60a can differ from, or be identical to, the second pattern 60*b*).

Figure 2D:
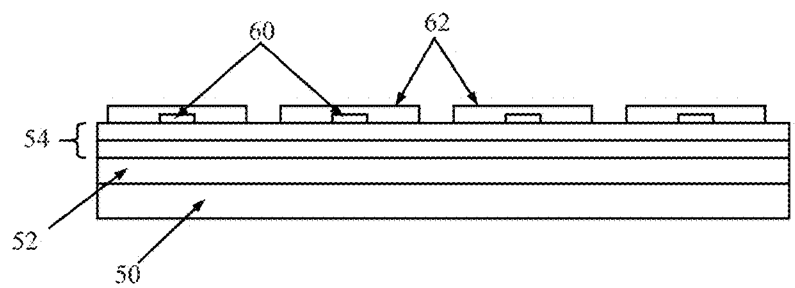

With reference to FIG. 2D, a window 62 (referenced generally) is formed over each of the patterns 60. A material of the window 62 can be an appropriate membrane or film material, such as $Al_2O_3$ film. $Al_2O_3$ is optically transparent and an electrical insulator. $Al_2O_3$ layers also show high transmission rate of electromagnetic waves in metamaterial configurations. Other materials are also envisioned. In some embodiments, windows 62 consisting of 150 nm thick $Al_2O_3$ with a lateral dimension of 150×150 $\mu m^2$ can be fabricated on top of the Ti (or other material) pattern 60, although other film materials and dimensions are also acceptable. Notably, the use of sodium hydroxide (NaOH), potassium hydroxide (KOH), and tetramethylammonium hydroxide (TMAH)

based developers can damage (or etch) Al and $Al_2O_3$ films. Thus, in some embodiments, an Al-compatible developer (e.g., AZ developer from AZ Electronic Materials) can be employed as part of the window formation process. Commensurate with the descriptions above, FIG. 2D reflects that a separate window 62 is provided or formed over the respective, discrete patterns 60; each window 62 and corresponding pattern 60 combine to define one of the patterned windows 28 (FIG. 1A) described above.

Figure 2E:
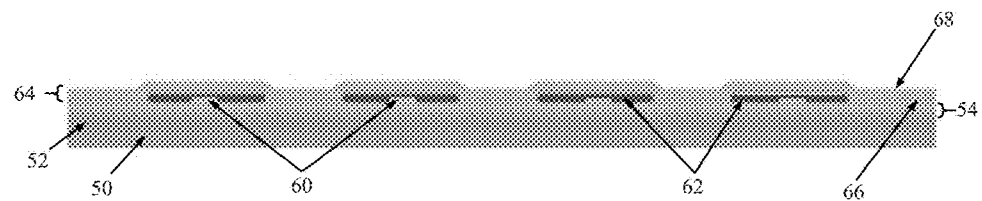

After the fabrication of the windows 62, an optional second protection layer 64 is formed or deposited as shown in FIG. 2E. Where provided, the second protection layer 64 can be akin to the first protection layer 54, for example including first and second sub-layers 66, 68. A material of the first sub-layer 66 can be selected to provide adhesion (e.g., Cr) and a material of the second sub-layer 68 is selected to serve as a seed layer (e.g., Cu).

Figure 2F:
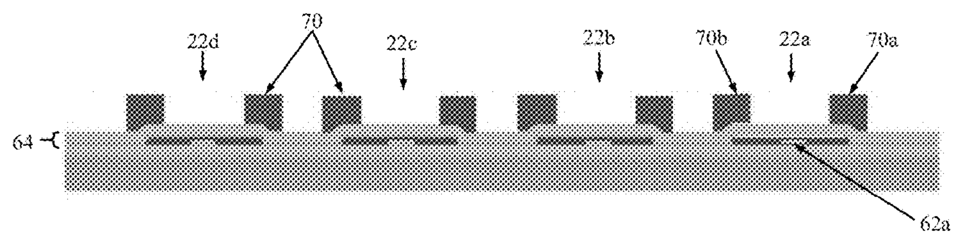

Regardless of whether or not the second protection layer 64 is provided, frames (i.e., the metal frames 30 (FIG. 1A)) are then formed. Frame segments 70 are generally shown in FIG. 2F as having been formed onto the second protection layer 64. As a point of reference, relative to the view of FIG. 2F, each of the completed frames 30 corresponds with a later-defined individual panel, and will consist of a plurality of interconnected ones of the frame segments 70. For example, first and second frame segments 70*a*, 70*b* are identified in FIG. 2F; though not shown in FIG. 2F, the frame segments 70*a*, 70*b* are interconnected in forming a complete frame that otherwise surrounds the first pattern 60a described above. By way of further clarification, with the frame segments 70 formed, it is possible to more readily visualize or designate partially-completed panels in the assembly; for example, immediately adjacent, first-fourth panels 22*a*-22*d* are generally identified in the view. The frame segments 70, and thus the frames 30, are formed, for example, via patterning (e.g., electrodepositing) with a flood exposure process. In some embodiments, the frame segments 70 are optionally formed of nickel (Ni). Some advantages of using Ni frames are the possibility of remote guidance using a magnetic field, which can be useful for a delivery system as well as detecting and tracking purposes. Additional reasons for the optional use of a Ni frame include the following: (i) A Ni frame helps with the self-folding process. That is, when the later-formed hinge (described below) is liquefied, the hinge materials (e.g., solder) do not transfer across the Ni surfaces due to the intermediate surface wetting property between the hinge material and Ni frame, so the hinge remains in the place where it is electrodeposited and lifts up panels when surface tension force is generated; (ii) A Ni frame enhances the stiffness of the cubic structure; and (iii) A thick layer of the Ni frame can be deposited using an electroplating process, which makes it easy to control the thickness and is compatible with other fabrication processes.

Figure 2G:
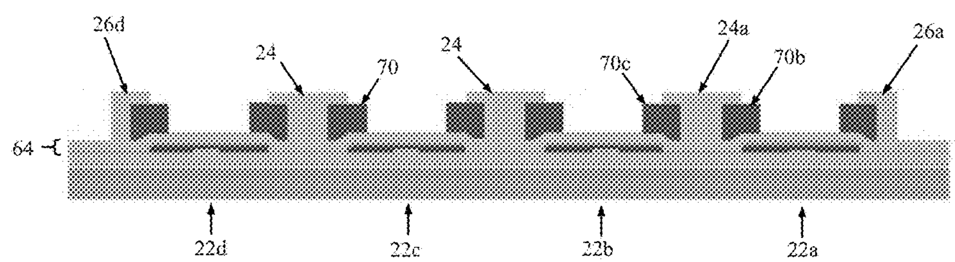
Figure 2H:
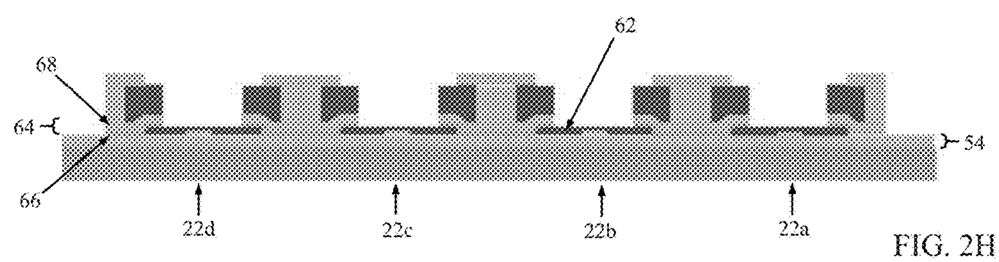

The hinges 24 are then formed or deposited as shown in FIG. 2G. A material of each of the hinges 24 can be deposited onto the second protection structure 64 and a portion of one or more of the frame segments 70. For example, the hinge 24*a* identified in FIG. 2G is formed across and connects the frame segment 70*b* of the first panel 22*a* and the immediately adjacent frame segment 70*c* of the second panel 22b. Other ones of the hinges 24 are similarly formed to interconnect immediately adjacent frame segments 70 of other ones of the panels 22*b*-22*d*. A material of the hinges 24 is selected in accordance with the descriptions above, and in some embodiments is solder (lead-tin or Pd—Sn). Other materials are also acceptable. The hinges 24 can be formed in various manners, and in some embodiments are deposited using electrode deposition methods. Where desired, one or more of the optional joint structures 26 can be formed simultaneously with the hinges 24 (e.g., the hinges 24 and the joint structures 26 are the same material and are formed during a continuous electrodeposition process). The view of FIG. 2G illustrates formation of a joint structure 26*a* at what will be a free edge of the first panel 22*a*, and a joint structure 26*d* at what will be a free edge of the fourth panel 22*d*.

Where provided, exposed portions of the second protection layer 64 are then removed to expose the first protection layer 54 and the window 62 of each of the panels 22*a*-22*d* as shown in FIG. 2H. Various methodologies can be employed for removal of the exposed second protection layer 64 as a function of the materials employed. For example, the second protection layer 64 (e.g., the first and second sub-layers 66, 68) can be dissolved by appropriate etchants. Where provided, exposed portions of the first protection layer 54 are similarly removed, resulting in the sub-assembly of FIG. 2I. As a point of reference, at the fabrication stage of FIG. 2I, the sub-assembly consists of a completed 2D intermediate structure 20 carried by the base substrate 50 via the sacrificial layer 52.

The 2D intermediate structure or template 20 is then removed from the base substrate 50 and the sacrificial layer 52. In some embodiments, to release the 2D template 20, the sacrificial layer 52 is dissolved, (e.g., where the sacrificial layer 52 is PMMA, the PMMA can be dissolved in an organic solvent (e.g., N-methyl pyrrolidone, NMP). Regardless, FIG. 2J reflects the removed 2D intermediate structure 20.

Figure 2I:
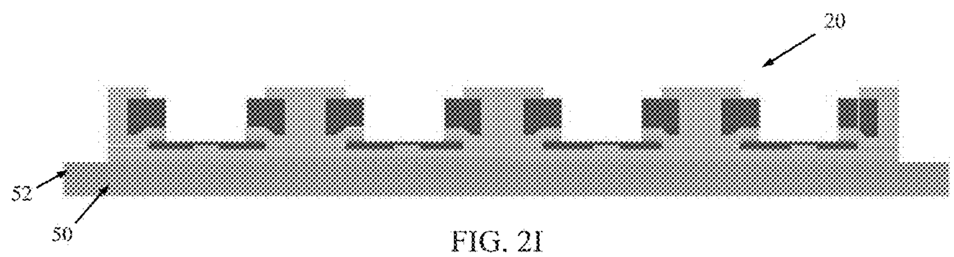
Figure 2J:
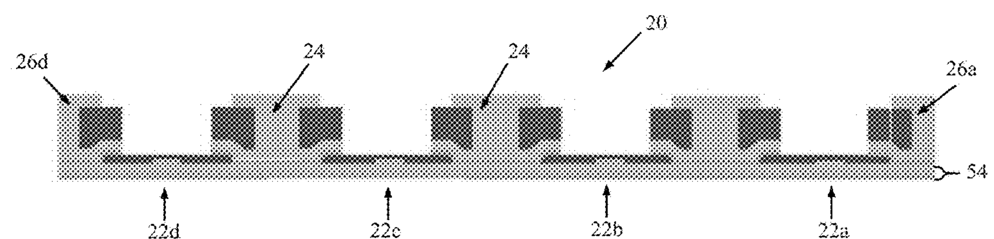
Figure 2K:
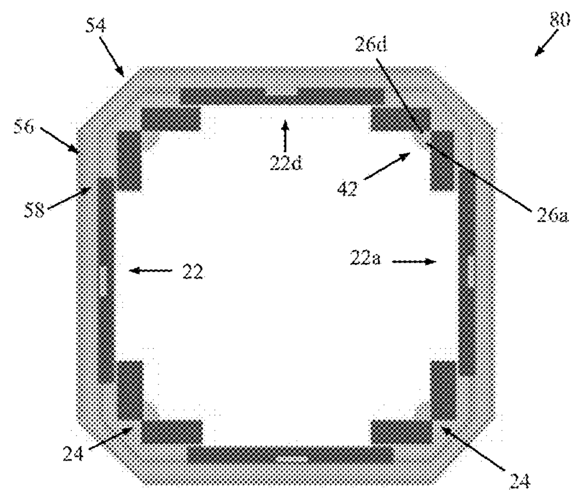
Figure 2L:
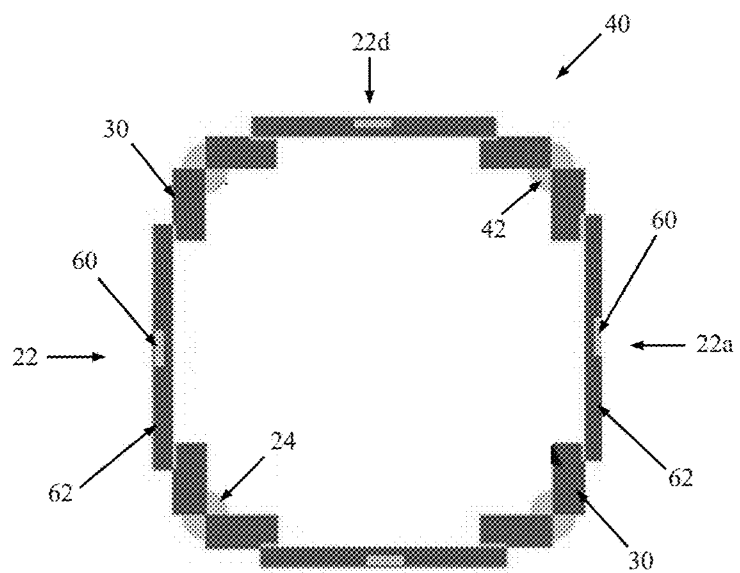

The released 2D intermediate structure or template 20 can then be caused to self-fold or self-assemble into a 3D shape. For example, the 2D intermediate structure 20 can be heated above the melting point of the material of the hinges 24 (e.g., approximately 200° C. for solder). A 3D microscale precursor device 80 resulting from the self-folding or self-assembly step is schematically shown in FIG. 2K. In transitioning to the state of FIG. 2K, the hinges 24 have caused the panels 22 to fold relative to one another. The precursor device 80 has the final, desired 3D shape. However, where provided, the first protection layer 54 (referenced generally) remains over the panels 22. The first protection layer 54 is then removed (e.g., the first and second sub-layers 56, 58 can be etched), resulting in the 3D microdevice 40 of FIG. 2L. For purposes of clarification, several of the panels 22, frames 30, windows 62 and patterns 60 (e.g., circuitry) are also identified in FIG. 2L. Further, and with cross-reference between FIGS. 2J-2L, as part of the self-assembly process, the joint structure 26*a* associated with the first panel 22*a* has come into contact and joined with the joint structure 26*d* associated with the second panel 22*d*, resulting in the completed joint 42 upon completion of the self-assembly process.

With reference to FIGS. 2A-2L, in some embodiments of the present disclosure the 2D intermediate structure 20 may be subjected to various stresses during fabrication and/or self-folding. By way of non-limiting example, during the lithography processes, a 150 nm thick and 15×150 $\mu m^2$ area $Al_2O_3$ window fixed on a Ni frame may be damaged by cracking, buckling, and/or delamination. Such damage is normally observed when the adhesion strength between a metal (or metal oxide) film and a polymer substrate is weak. While not wishing to be bound by any theory, the inventors of the present disclosure surmised that direct deposition of $Al_2O_3$ films on the PMMA substrate, for example, may induce poor adhesion between the $Al_2O_3$ films and PMMA layers. Also, during the self-assembly process, the heat applied up to the melting point of the hinge material (e.g., approximately 200° C. for solder hinge material) generates a surface tension force ($F_\gamma$) which transforms 2D nets or arrays into 3D structures, but may also deform and bend the frames 30 causing a delamination and cracking problem, leading to low yield of <10%. During the self-assembly process, the surface tension force generated from the hinges induces rotation of the panels (θ). The surface tension force $F_\gamma$ acts on the circumference of the molten hinge and the fluid force ($F_f$) induced by the rotation of a frame (a panel) acts in an opposing direction. These opposing forces may be one factor causing damage to the $Al_2O_3$ films (or other film materials used for the surface patters 60 on the windows 62). In addition, as the temperature of the solvent used to remove or dissolve the sacrificial layer 52 (e.g., NMP can be used to dissolve a PMMA sacrificial layer) is increased to induce the self-assembly process for structures submerged in the solvent, an external force can be generated due to increased mass motion (convection currents) of the solvent fluid, resulting in damage on the window 62 (e.g., damage to $Al_2O_3$ films).

Figure 3:
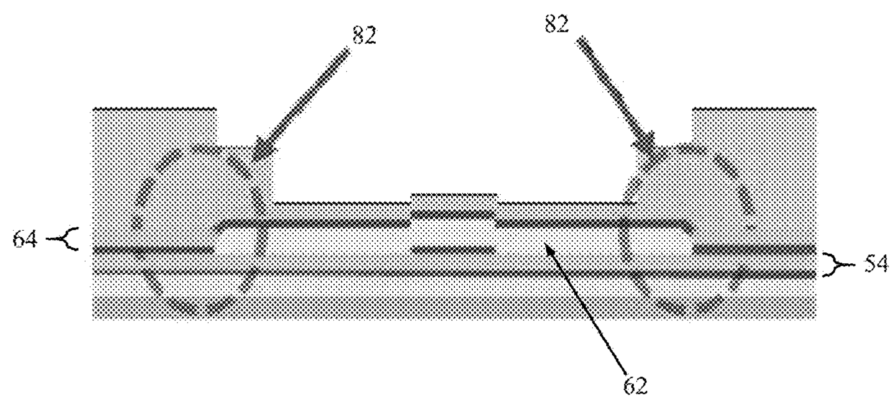
FIG. 3 is an enlarged, schematic illustration of a portion of the 2D intermediate structure of FIG. 1A.

In order to address the one or more of the issues above, optional embodiments of the present disclosure form the 2D intermediate structure 20 to include the first and second protection layers 54, 64. With reference to FIG. 3, these two protection layers 54, 64 make a sandwiched structure (e.g., $Cr/Cu/Al_2O_3/Cr/Cu$), which clamps and protects the window 62 (e.g., $Al_2O_3$ film) from the stresses and the external forces possibly leading to delamination, until it is completely self-folded. The sandwich arrangement is highlighted in FIG. 3 at 82. In other words, the sandwich structure minimizes mechanical damages induced by chemical attack, stress on the thin films, and external forces, such as fluid pressures, applied during the fabrication processes, including self-assembly. Finally, the protection layers 54, 64 can later be removed by etchants after self-assembly (e.g., the optional chromium and copper sub-layer materials of the protection layers 54, 64 can be removed by etchants). Surprisingly, this approach can exhibit a beneficial improvement in yield (e.g., yield of approximately 90%).

In addition, and returning to FIG. 1A, during the self-assembly process, the position or direction of the 2D panels 22 does not affect the yield. Whether the 2D intermediate structure 20 is facing upward or downward, the self-assembly process will occur; that is, even if the 2D intermediate structure 20 is facing down, the surface tension torque generated by, for example, the metal reflow of the hinges 24 overcomes the weight of the overall structure (or gravitational torque) and is able to fold the 2D panels 22. The torque due to surface tension is expressed as: $T_\gamma=\gamma r \cos(\alpha)$, where γ is the surface free energy of the liquid-vapor interface per unit area (approximately 0.6 N/m in some non-limiting embodiments), r is radius of the hemisphere when the solder liquefies (approximately 10 μm in some non-limiting embodiments) and α is the angle of the deformed hinge (when α=0°, $T_\gamma$ will be maximum). The maximum $T_\gamma$ can be calculated as approximately 6 μm per unit length in some embodiments. A hinge for 200 μm-length cubes would then exert a maximum torque of approximately 1.2 nNm. Moreover, the torque due to the weight (gravity) of the panel 22 is given by: $T_f=\{\rho b^2 dg/2\}\cos\theta$. Here, ρ is the density of the panel material (for Ni, approximately 8.9 $g/cm^3$), b is the length of the panel 22 (e.g., 200 μm in some non-limiting embodiments), d is the thickness of the panel 22 (e.g., approximately 7 μm in some non-limiting embodiments), and θ is the folding angle of the panel 22 induced by the molten hinge 24 (when θ=0°, $T_f$ will be maximum). The maximum $T_f$ calculated to be approximately 0.012 μNm per unit length and a frame of length 200 μm-length cubes would then exert a maximum torque of approximately 0.00244 nNm. Based on the equations, the torque ($T_\gamma \approx 1.2$ nNm) due to surface tension is approximately 500 times larger than the torque ($T_f \approx 0.00244$ nNm) due to the panel weight (or gravity) making this torque effectively negligible. Hence, the direction the panels 22 of the 2D intermediate structure 20 face does not affect the yield.

Figure 4A:
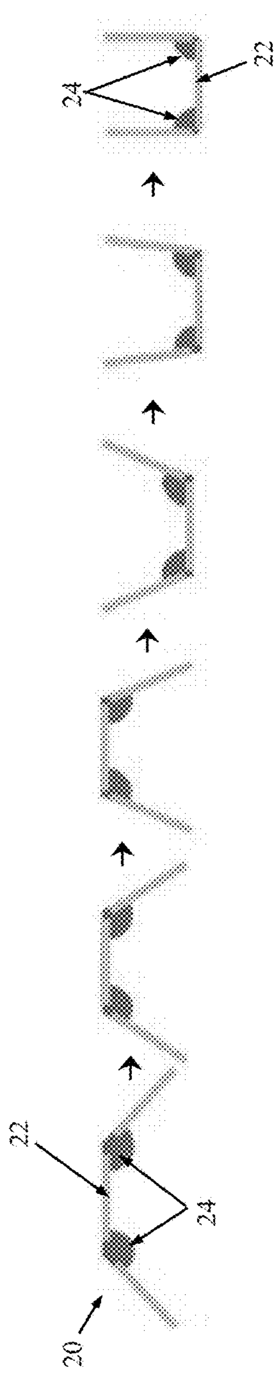
FIGS. 4A and 4B are a schematic illustrations of self-folding a 2D microstructure initiating at different spatial orientations.
Figure 4B:
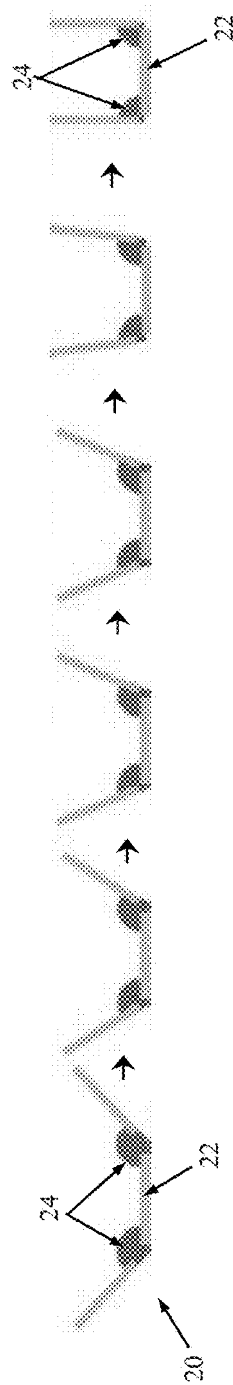

In addition, in some embodiments of the present disclosure, at some point in the self-assembly process, the 2D intermediate structure 20 will naturally revert to an upright orientation. For example, FIG. 4A schematically illustrates progressive self-assembly of a 2D intermediate structure initially facing down (i.e., the left-most illustration of FIG. 4A reflects an initial stage of self-assembly, with the hinges 24 associated with the identified panel 22 facing "down"). It has surprisingly been found that as the 2D intermediate structure 20 progresses through self-assembly (from left to right in the sequential arrangement of FIG. 4A), the 2D intermediate structure 20 naturally flips so that the hinges 24 associated with the panel 22 are now facing upwardly. FIG. 4B schematically illustrates progressive self-assembly of a 2D intermediate structure that begins the self-assembly process with the panel 22 facing upwardly; under these circumstances, it was surprisingly found that the intermediate structure 20 did not experience a flip in orientation. This characteristic is beneficial since this property eliminates the additional task of laying out the 2D structure 20 facing upward. Otherwise, it might be necessary to control the direction of the panel 22 face before the self-assembly process so that the structure always faces upward. Such a task, rearranging the structures without making any damage to the windows of, for example 150 nm thick $Al_2O_3$ with lateral dimension of 150×150 $\mu m^2$, is a challenge since flipping them over may require applying additional external forces to an already very fragile structure. The task would also be time consuming and, therefore, less appropriate for mass production.

Figure 5:
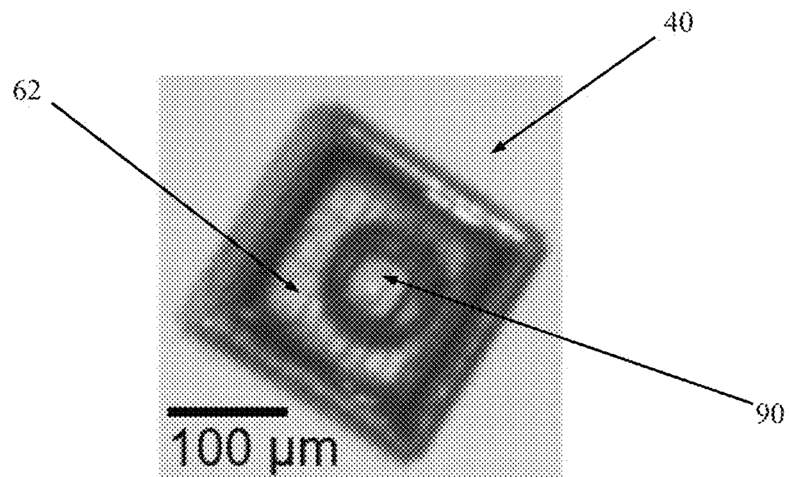
FIG. 5 is an optical image of a micro-scale, optically transparent, enclosed 3D microdevice in accordance with principles of the present disclosure in the presence of IPA.

In some embodiments, since the windows 62 configured with the dielectric material (e.g., $Al_2O_3$) is highly thin (e.g., on the order of 150 nm thickness), the inside of the 3D microscale device 40 can be viewable through the windows in some embodiments. For example, FIG. 5 is an optical image of a 3D microscale device 40 in accordance with principles of the present disclosure including metal patterning on $Al_2O_3$ windows 62. In addition, a microbubble 90 was formed inside the 3D microscale device 40. The windows 62 are optically transparent, such that the microbubble 90 is visible. The bubble 90 was produced by transferring the 3D microscale device 40 from water to isopropyl alcohol (IPA), and was found to disappear in an hour, indicating that the microscale device 40 can be water tight and potentially gas tight. In other embodiments, the contained microbubble (or multiple microbubbles) can be formulated to remain intact for an extended period of time. Accordingly, in some embodiments, the microscale 3D devices of the present disclosure are configured for use as microscale 3D capsules or containers with viewing windows, allowing one to easily estimate the volume of a substance encapsulated in the micro containers. Hinges at each side of the panels are optionally designed not only to self-fold but also to seal the cube after folding, so the inside of the cube can be completely isolated from the outside. The optional $AL_2O_3$ film window also acts as a gas diffusion barrier and protection layers, allowing these cubes to be used as smart chemical storage containers.

A wide variety of different patterns (e.g., circuitry) can be provided on the panels of the functionalized 3D microdevices of the present disclosure. One non-limiting example is a split ring resonator (SRR). In this regard, and as described in the Examples Section below, functionalized 3D microdevices with patterned SRRs are readily fabricated in accordance with principles of the present disclosure.

Functionalized, free-standing 3D microdevices can be generated by the origami-inspired self-folding methods of the present disclosure. These and other approaches allow for the fabrication of 3D microdevice with a wide range of materials, shapes and sizes with desired electric define patterning on the 3D structure. The 3D microdevices of the present disclosure are beneficial or useful in numerous, diverse end-used applications, such as next generation biomedical, electronic, and optical devices, including sensors and electric circuits, utilizing the numerous advantages of 3D configurations. With embodiments in which the 3D microdevice incorporates a dielectric substrate or film, some applications include as a multifunctional device, containing pressure, chemical gas, and humidity for use a sensors, memory devices, and capacitors with wireless communications (possibly in space as well). Alternatively, available dielectric materials (e.g., $Al_2O_3$ or $SiO_2$) are capable of electronic circuit and high optical transparency. Alternatively, the functionalized 3D microdevices of the present disclosure can be configured as programmable containers (e.g., drug delivery with remote control by magnetics). Alternatively, the functionalized 3D microdevices of the present disclosure can be configured as a tunable THz sensor or detector, for example to detect microorganisms in the human body (e.g., fungi, bacteria and viruses). Alternatively, the functionalized 3D microdevices of the present disclosure can be configured to grow a functional tissue or organ inside of the polyhedral structure (necessary to culture in 3D), utilizing electrical stimulus form the circuit by heat, current, radial frequencies, etc. Alternatively, the functionalized 3D microdevices of the present disclosure can be used as a picosatellite with air pollutants (e.g., fire alarm) and weather checking (e.g., global warming) system with communication with satellite. Alternatively, the functionalized 3D microdevices of the present disclosure can be used with wireless sensing in 3D media such as brain, detection of bacteria or viruses by frequency shift, etc.

Embodiments and advantages of features of the present disclosure are further illustrated by the following non-limiting examples, but the particular materials and amounts thereof recited in these examples, as well as other conditions and details, should not be construed to unduly limit the scope of the present disclosure.

EXAMPLES

Figure 6:
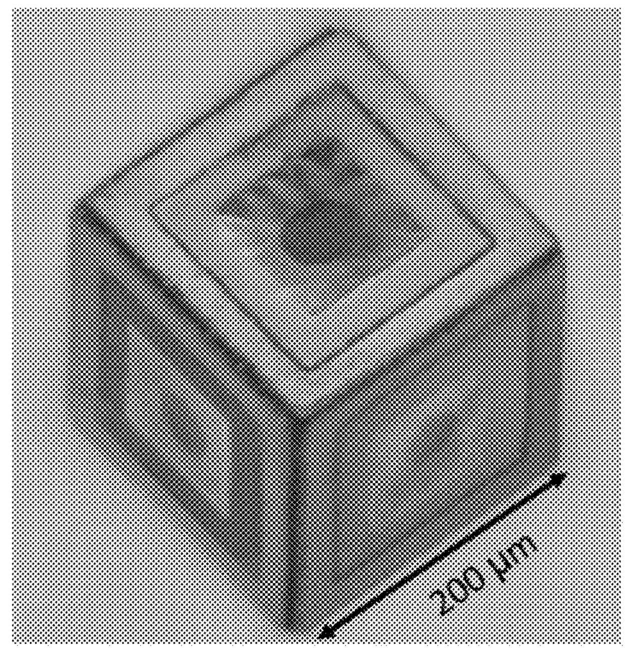
FIG. 6 is a magnified optical image of a functionalized 3D microdevice of the Examples section.

3D Microdevices with Ti Pattern 3D microdevices in accordance with principles of the present disclosure incorporating Ti patterned windows were constructed in accordance with the methods described above. With reference to the steps shown in FIGS. 2A-2L, a 1 μm thick poly(methyl methacrylate) (PMMA A9) sacrificial layer (layer 52) was deposited on a polished Si wafer (layer 50); spun at 2500 rpm for 1 min and baked at 190° C. for 5 min on a hot plate (FIG. 2A. Cr (10 nm) and Cu (150 nm) layers (sub-layers 56, 58, respectively) were deposited using an e-beam evaporator (FIG. 2B). For Ti pattern fabrication, a photo resist (Microposit® S1813 photoresist available from MicroChem Corp., Newton, Mass.) was deposited, spun at 2500 rpm for 1 min, and baked at 115° C. The pattern was exposed to a UV light source for 10 sec and developed in a developer solution Microposit® MF®-319 (MicroChem Corp., Newton, Mass.) for 1 min. The sample was flood exposed for 20 sec without a mask. 50 nm Ti was deposited using an e-beam evaporator (FIG. 2C). Next, the sample was immersed in the developer solution AZ® Developer (from AZ Electronic Materials, Charlotte N.C., a division of Merck KGaA) to dissolve any unwanted area. An $Al_2O_3$ window (window 62 in FIG. 2D) was then fabricated on each of the Ti patterns. A positive photoresist (Megaposit™ SPR™ 220, distributed by MicroChem Corp., Newton, Mass.) of 10 μm thickness was spin-coated (1700 rpm for 60 sec) on top of the prefabricated substrate followed by baking at 115° C. for 60 seconds and a rest time of 3 hours. The sample was UV exposed on a contact mask aligner for 80 sec and developed for 90 sec in a positive resist developer (Microposit® MF® CD-26, MicroChem Corp., Newton, Mass.). The dimension of each face of the window was 150×150 $\mu m^2$ (width×length). After development, the sample was UV flood exposed, to lift-off unwanted area, for 120 sec. Then, a 150 nm thick $Al_2O_3$ window was deposited by using an e-beam evaporator. The sample was immersed in a positive resist AZ developer solution AZ® Developer (from AZ Electronic Materials, Charlotte N.C., a division of Merck KGaA) for 10 min. This process dissolved any unwanted area, resulting in the completed windows (window 62 in FIG. 2D). Another layer of 10 nm thick Cr and 150 nm thick Cu were deposited on top of the patterned windows (sub-layers 66, 68, respectively, FIG. 2E). Frames were formed at each of the panels (e.g., frame segments 70, FIG. 2F) by electrode deposition of Ni (approximately 10 μm). The Ni solution was obtained from Transene Company, Inc., Danvers, Mass. During the nickel electrodeposition, a constant current was applied at a typical current density of approximately 32 $mA/cm^2$. Hinges were then formed at each of the panels (e.g., hinges 24, FIG. 2G) by electrode deposition of solder (Pb—Sn, approximately 20 μm). The Pb—Sn alloy solution was a mixture of 40% (volume ratio) Deionized water, 10% methane sulfonic acid (Techni Solder NF acid), 13.3% tin concentrate (Techni Solder NF Tin concentrate (300 g/l)), 40% lead concentrate (Techni Solder NF Lead concentrate (500 g/l)), 10% electrolyte solution (Techni JM 6000 Makeup), 1.5% propylene glycol additive (Techni JM 6000 Secondary), and 2% antioxidant (Techni Antioxidant). All components of the solder alloy solution were obtained from Transene Company, Inc., Danvers, MA. During the solder electrodeposition, a constant current was applied at a typical current density of approximately 32 35 $mA/cm^2$. Later, exposed portions of the Cu/Cr layers (between patterns) were dissolved by appropriate etchants (FIGS. 2H and 2I). An ammonium persulfate etchant (APS-100 Copper Etchant from Transene Company, Inc., Danvers, Mass.) was used to dissolve exposed Cu surface area. A hydrochloric acid etchant (Chromium Etchant CRE-473 from Transene Company, Inc., Danvers, Mass.) was used to dissolve exposed Cr surface area. To release the 2D intermediate structures or templates, the PMMA was dissolved by N-Methyl-2-pyrrolidone (NMP-based stripper from MicroChem Corp., Newton, Mass.) (FIG. 2J). The released template was heated above the melting point of the hinge materials (approximately 200° C.) and assembled into the cubic shape followed by a rinsing process with IPA (FIG. 2K). Finally, the remaining Cr/Cu layer deposited on the 3D structure was removed by the etchants listed above, again followed by a rinsing process with water. The resultant functionalized microdevices were stored in IPA. An optical image of a so-constructed 3D microdevice (with Ti patterned windows) is provided in FIG. 6.

3D Microdevices with Al SRR Pattern—Fabrication

Figure 7A:
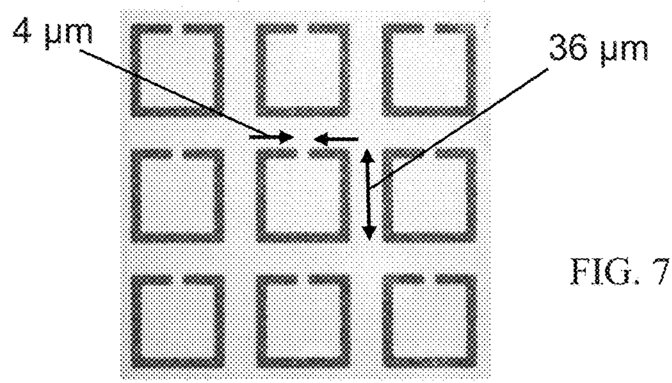
FIG. 7A is an enlarged optical image showing 3×3 array of SRRs consisting of "C-shaped" SRRs of the Examples section.
Figure 7B:
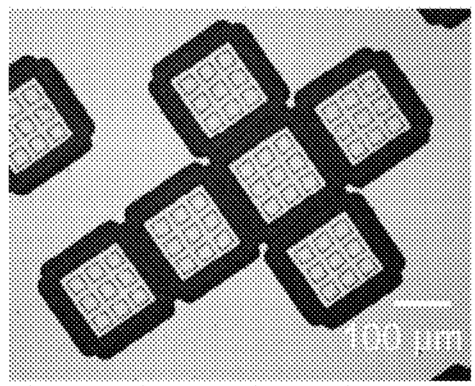
FIG. 7B is an optical image of a 2D intermediate structure defined with SRRs of the Examples section.
Figure 7C:
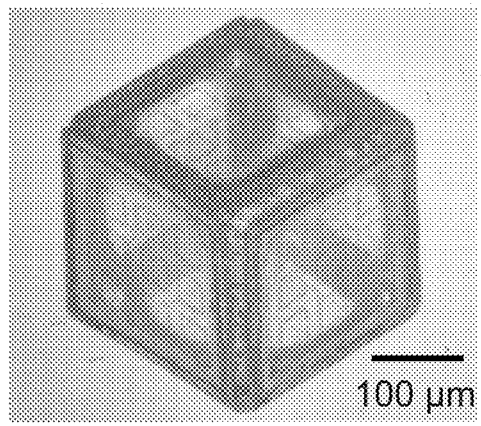
FIG. 7C is a magnified optical image of a functionalized 3D microdevice with SRRs of the Examples section.

To demonstrate the versatility of the methods of the present disclosure in fabricating 3D, free-standing devices, terahertz (THz) split ring resonators (SRRs) patterned (as aluminum (Al)) on the surface of 200 μm and 500 μm sized, free-standing, cubic structures configured with $Al_2O_3$ windows were fabricated. The manufacturing steps were generally identical to the Ti patterned 3D microdevices above unless otherwise noted. The Ti pattern was replaced with an array of SRRs (C-shaped). For the 200 μm samples, a 3×3 array of SRRs was patterned; for the 500 μm samples, a 7×7 array of SRRs was patterned. Each SRR was formed of aluminum at a thickness of 150 nm. As shown in the optical image of FIG. 7A, the SRRs had 36 μm sides with a trace width of 4 μm and a gap of 4 μm. FIG. 7B is an optical image of an intermediate structure (prior to self-assembly) including the patterned SRRs. FIG. 7C is a magnified optical image of a resultant functionalized 3D microdevice including the SRRs as a free-standing 200 μm-wide 3D cube.

3D Microdevices with Al SRR Pattern—THz Measurements

Figure 8:
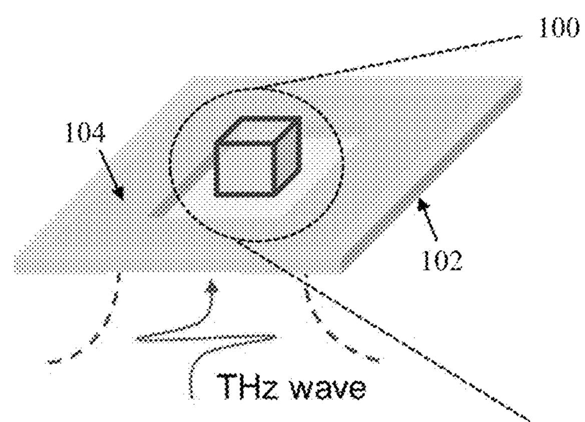
FIG. 8 is a schematic illustration of a portion of a fabrication method of the Examples section.

To optically characterize the 3D cubes with SRR patterns, terahertz (THz) time-domain spectroscopy (approximately 0.3-2.0 THz) with a single-cycle picosecond pulse, which is generated from a commercial GaAs emitter (Tera-SED planar large-area GaAs based photo-conductive emitter from Laser Quantum Ltd., Cheshire, UK) illuminated by a Ti:sapphire laser pulse train with 780 nm center wavelength, 80 MHz repetition rate, and 90 fs pulse width (MaiTai® XF Ti:sapphire oscillator from Spectra-Physics, Santa Clara, Calif. (a Newport Company)) was performed. FIG. 8 schematically illustrates the THz transmission measurement of a single example 3D microdevice 100 placed on the center of a 1×1 $mm^2$ aperture in a stainless steel plate 102. As shown, transparent tape 104 (i.e., Scotch brand transparent tape from 3M Company), which is transparent in THz frequency region, was used to retain the 3D microdevice 100 on the center of the aperture. It should be noted that the sample 3D microdevices were solid enough to individually place them anywhere, even on adhesive tapes. The P-polarized THz light was illuminated from the entrance of the aperture, passed through the SRRs patterned on the single cube 100, and was detected with an electro-optic sampling method using a 1 mm-thick ZnTe crystal (from Ingcrys Laser System Ltd., UK). The transmission was calculated in decibels using the formula $10 \cdot \log(P_1/P_2)$ where $P_2$ is the intensity of the source and $P_1$ is the intensity measured at the detector.

Figure 9A:
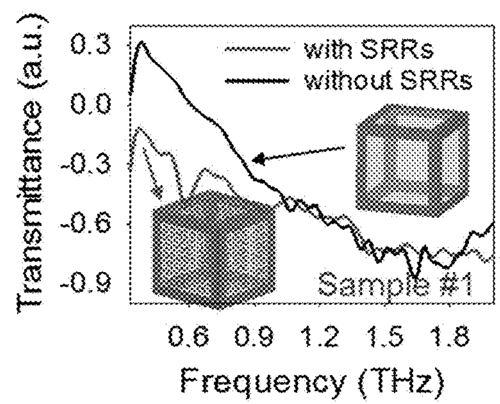
FIG. 9A is a graph of measured THz transmittance described in the Examples section.
Figure 9B:
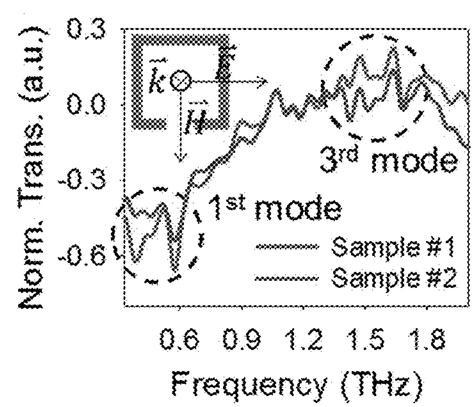
FIG. 9B is a graph of normalized measurement of THz transmittance described in the Examples section.
Figure 9C:
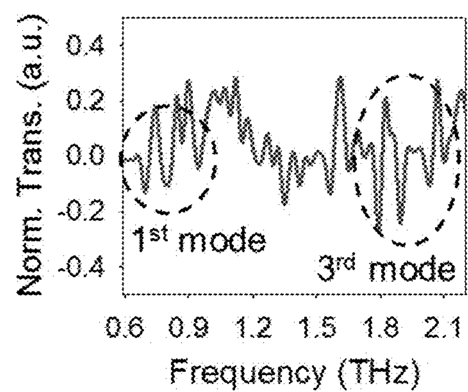
FIG. 9C is a graph of simulation results of 7×7 SRRs with Ni frames described in the Examples section.

Single samples of the 500 μm-wide cube with 49 (7×7) resonators on each face were subjected to the THz transmission spectrum measurement protocols described above. First, the transmission spectrum of a "blank" $Al_2O_3$ 3D microdevice with the Ni frame and solder hinges (i.e., a 500 μm-wide cube was constructed using the fabrication techniques of this Example Section, except that no pattern was provided on the windows). Measurement of 3D microdevice with SRRs samples was then performed. The results of these measurements are reported in FIG. 9A. In order to fully assess the resonance properties of only the SRRs structure, the results were divided by each other to eliminate the impact of the Ni frame and the solder hinge, giving the normalized SRRs response as seen in FIG. 9B. The measurements were performed keeping the resonant structures with the H-field oriented perpendicular to the gap of the SRRs (FIG. 9B inset). SRRs patterned on two cubes (samples #1 and #2) showed similar first and third mode peaks of the SRRs at the specific frequencies of approximately 0.5 and approximately 1.6 THz (FIG. 9B). FIG. 9C provides simulation results of 7×7 SRRs with Ni frames. The resonance modes of SRRs are in good agreement with the measurement results. As a point of reference, transmission curves were plotted in log scale (Transmission=$10 \cdot \log(P_1/P_2)$ where $P_2$ is the intensity of the source and $P_1$ is the intensity measured at the detector).

3D Microdevices with Al SRR Pattern—Finite Element Modeling Simulations

To further understand the resonance behavior of the sample 3D microdevices, finite element modeling (FEM) simulation using a high-frequency structural simulator (HFSS software from Ansys Inc., version 13.0.1) was performed. HFSS version 13.0.1 uses a Finite Element method (FEM) to divide the 3D structure into smaller tetrahedral structures which collectively form a mesh. Solutions to Maxwell's equations are then found across all the mesh points and a generalized S-matrix is produced. A 2D simulation of a 7×7 Al SRR (thickness 150 nm) array on an $Al_2O_3$ substrate (thickness 150 nm) placed inside a vacuum box (measuring 500 μm on each side) was performed. The size of the vacuum box was chosen to be large enough to not affect the resonant frequency. The solder (Pb/Sn) hinge was not included in simulation studies. The SRRs were found to retain their original resonant frequency, which did not significantly change in the presence of a Ni frame and a hinge. Hence, it showed that not a very strong coupling exists between the frames/hinges, and the SRRs; the transmission response is merely a superimposition of their individual resonance. Hence, the effect of solder hinges on the SRRs resonance was ignored as it is much farther from the resonator than the Ni frame. The resulting transmission response was calculated based on 13 refinements involving 200,000 tetrahedrons with final deviation less than 0.01 over a frequency sweep between 0.02 and 4 THz with a step size of 0.025. The transmission spectrum is based on measuring the $S_{21}$ parameter which gives the forward power gain in decibel. Hence, the simulated response gave a close approximation of the expected measurement result.

Due to computational limitations, simulations of the individual faces of the cube were performed. Four of the six faces of the cubes had the wave parallel to the SRRs and thus demonstrated a weak coupling of the wave thereby causing little effect on the transmission spectrum; only the two faces (top and bottom of the cube) with the incident wave perpendicular to the SRRs showed a strong coupling of the wave and significantly affected the transmission. Since both the top and bottom faces contain the same orientation of the SRR, simulation of any one of them provides reasonable extrapolation of a resonant frequency. To assess the effect of the Ni frame on the resonance properties of the SRRs, the structure with and without the Ni frame and only the Ni frame on an $Al_2O_3$ window with no SRRs was simulated. FIG. 10A provides simulation results with and without SRRs; FIG. 10B is a normalized plot calculated from FIG. 10A. As a point of reference, FIG. 10B is identical to FIG. 9C. FIG. 10C shows a simulation result of SRRs on $Al_2O_3$ without a Ni frame.

Figure 11:
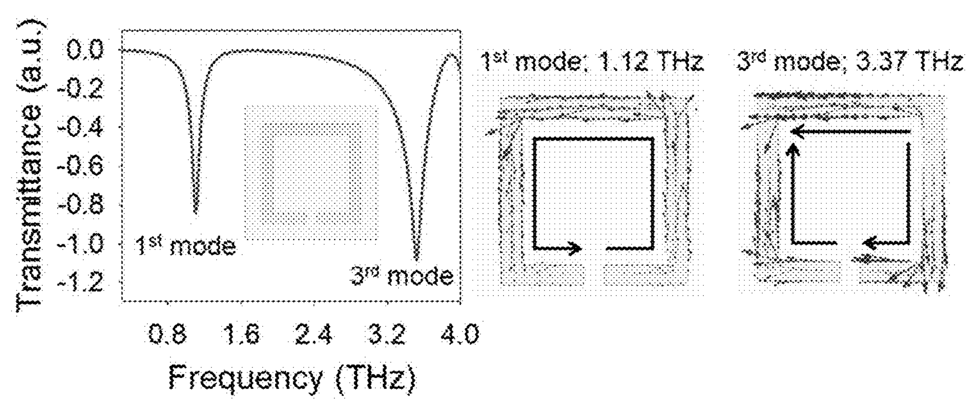
FIG. 11 illustrates simulated transmittance response of a single resonator described in the Examples section.

The Ni frame on each side has a resonant frequency of 0.2 THz and hence caused what appeared to be multiple sub-bands; in the absence of a Ni frame, the structure still showed multiple resonance (or sub-bands peaks) behaviors (FIG. 10C). In order to find other factors relating to multi sub-band properties, simulations of the structures with a single SRR were performed. As shown in FIG. 11, the multiple peaks disappear to display only 2 peaks corresponding to first and third mode, respectively. This supports the theory that coupling between adjacent resonators causes a change in the mutual inductance, thereby causing a shift in the resonant frequency; moving to the SRRs at the center, from those at the edge of the window, this resonance shift increases causing multiple bands. Further simulations consisting of designs with varying thickness of the alumina window were conducted, and it was observed that the subbands reduce as the thickness of the alumina increases. As the thickness of the window increases, the capacitance between the gap of the SRR increases, thus masking the shift caused by mutual inductance between resonators. These results indicate a major factor for the multiple sub-bands is not only resonance behavior induced by Ni frames, but also coupling between adjacent SRRs within the 150 nm thick $Al_2O_3$ windows.

On observing surface current density distributions at each of the peaks in FIG. 10B, it was found that the four resonant peaks between 0.69-1.0 THz displayed a first mode current whereas, the four peaks between 1.8-2.2 THz displayed a third mode current (FIG. 10D). On the other hand, for the measurement, the peaks are observed at 0.47 THz and 1.50 THz regimes. The slight differences between the simulated and measured resonant frequencies are seen since the simulation responses are calculated for individual faces of the cube whereas the measured data takes into account the entire hollow structure.

The simulation demonstrated that the transmission response was a superimposition of the individual transmission of the Ni frame and SRRs; the two elements did not appear to have a strong coupling between them and resonated at their original resonant frequencies as in the absence of the other. A similar effect can be expected for the solder hinges which are at a greater distance from the SRRs than the Ni frame, thereby further reducing any effect they may have on the resonance of the SRRs.

The strong resonant peaks, with a low frequency seen in the measured spectrum (FIG. 9A) were attributed to the Ni frame which has a low resonant frequency due to its large dimensions. After normalization in the absence of any other metallic structures besides the SRRs (FIG. 9B), the measurement still showed multiple resonance behaviors. The above-described comparison of simulations of a single SRR defined on a window (FIG. 11) to that of an array of SRRs (FIG. 10C) unlike the single SRR, which did not show sub-bands peaks, the 7×7 SRR array showed multiple sub-bands peaks. The multiple sub-band peaks could be explained by the non-uniform coupling between the SRRs in the array where the SRR in the center experiences a strong shift in frequency, unlike those closer to the edge of the cube. Thus, the simulated responses (FIG. 9C) explain the measured resonance behavior and are in good agreement. Slight shift in resonant frequency and amplitude between the simulated and measured spectra was seen due to the permittivity change induced by the five un-simulated $Al_2O_3$ ($\varepsilon_r$=9.8) faces of the cube and the SRRs parallel to the wave.

The simulated surface current density distributions (FIGS. 10A-10D) indicate that the peaks at around the 0.47 THz and 1.50 THz regimes are first and third modes of electrical resonance coupled with a SRR, respectively. It should be noted that the results presented here are the first direct transmission spectra measurement, resonating in THz regimes, of SRRs patterned on a free-standing, microscale, 3D structure. Previously, theory and modeling analysis of the transmission spectra of SRRs on a 3D cube have been developed to explore isotropic SRR sensors. However, realization of SRRs on 3D microscale cubes has not been accomplished before the discoveries of the present disclosure study due to the fabrication complexity of such devices.

Although the present disclosure has been described with reference to preferred embodiments, workers skilled in the art will recognize that changes can be made in form and detail without departing from the spirit and scope of the present disclosure.

What is claimed is:

1. A method of making a functionalized 3D microdevice, the method comprising:

forming a 2D intermediate structure including a plurality of micropanels and hinges, wherein each micropanel includes:

a metal frame, a window supported within the frame, the window formed of a dielectric material, a microscale conductive pattern formed on the window;

wherein the micropanels are connected to one another and arranged in an array, and further wherein a respective one of the hinges extends between and interconnects immediately adjacent ones of the panels within the array; and heating the 2D intermediate structure, wherein the step of heating includes each of the hinges self-folding to transition the 2D intermediate structure into a functionalized 3D microdevice.

2. The method of claim 1, wherein the step of forming includes:

forming a sacrificial layer over a substrate;

depositing a first protection layer over the sacrificial layer; and depositing a window material over the first protection layer so as to define the window of each of the panels.

3. The method of claim 2, wherein the step of forming further includes:

removing the sacrificial layer to release the 2D intermediate structure from the substrate.

4. The method of claim 3, wherein the sacrificial layer is poly(methyl methacrylate).

5. The method of claim 4, wherein the step of removing the sacrificial layer includes dissolving the sacrificial layer in an organic solvent.

6. The method of claim 4, wherein the step of depositing a first protection layer includes:

depositing a first sub-layer including chromium onto the sacrificial layer; and depositing a second sub-layer including copper onto the first sub-layer.

7. The method of claim 2, wherein the step of forming further includes:

depositing a second protection layer over the window material.

8. The method of claim 7, wherein the step of forming further includes:

depositing a conductive pattern material over the first protection layer prior to the step of depositing the window material to define the microscale conductive pattern of each of the panels.

9. The method of claim 8, wherein the step of forming further includes:

depositing a frame material over the second protection layer to define the frame of each of the panels.

10. The method of claim 9, wherein the step of forming further includes:

depositing a hinge material over a portion of the frame material and a portion of the second protection layer to define the plurality of hinges.

11. The method of claim 10, wherein the step of forming further includes:

removing the sacrificial layer to release the 2D intermediate structure from the substrate following the step of depositing the hinge material;

wherein the step of removing includes at least a portion of the first protection layer and an at least portion of the second protection layer remaining with the released 2D intermediate structure.

12. The method of claim 11, wherein the step of forming further includes:

removing exposed portions of the first and second protection layers prior to the step of removing the sacrificial layer.

13. The method of claim 12, further comprising:

removing exposed portions of the second protection layer following the step of heating the 2D intermediate structure.

14. The method of claim 1, wherein the step of forming further includes:

forming a first joint structure at a free edge of a first panel of the plurality of panels; and forming a second joint structure at a free edge of a second panel of the plurality of panel;

wherein the step of heating includes the first and second joint structures combining to form a completed joint with self-folding of the 2D intermediate structure.

15. The method of claim 1, wherein the window of each of the panels is an aluminum oxide film.

16. The method of claim 1, wherein the frame of each of the panels includes nickel, and further wherein each of the hinges includes solder.

17. The method of claim 1, wherein the microscale conductive pattern of each of the panels is formed of a material selected from the group consisting of metal, metal alloy, insulator, and semiconductor material.

18. The method of claim 1, wherein the microscale conductive pattern of at least one of the panels includes an array of split ring resonators.

19. The method of claim 18, wherein the microscale conductive pattern of each of the panels is an array of split ring resonators.

20. The method of claim 1, wherein the functionalized 3D microdevice has a polyhedral shape and defines an open interior volume.

* * * * *